(12) United States Patent
Chang et al.

(10) Patent No.: US 11,955,392 B2
(45) Date of Patent: Apr. 9, 2024

(54) SYSTEM AND METHOD FOR MEASURING DEVICE INSIDE THROUGH-SILICON VIA SURROUNDINGS

(71) Applicant: Taiwan Semiconductor Manufacturing Company, Ltd., Hsinchu (TW)

(72) Inventors: Shuo-Wen Chang, Hsinchu (TW); Yu-Hsien Li, Hsinchu (TW); Min-Tar Liu, Jhubei (TW); Yuan-Yao Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 267 days.

(21) Appl. No.: 17/318,388

(22) Filed: May 12, 2021

(65) Prior Publication Data

US 2022/0367299 A1  Nov. 17, 2022

(51) Int. Cl.
*H01L 21/66* (2006.01)
*G01R 31/28* (2006.01)
*H01L 23/538* (2006.01)

(52) U.S. Cl.
CPC .......... *H01L 22/32* (2013.01); *G01R 31/2801* (2013.01); *H01L 22/12* (2013.01); *H01L 22/14* (2013.01); *H01L 22/34* (2013.01); *H01L 23/5384* (2013.01)

(58) Field of Classification Search
CPC ......... H01L 22/12; H01L 22/14; H01L 22/22; H01L 22/34
See application file for complete search history.

(56) References Cited

U.S. PATENT DOCUMENTS

| | | | |
|---|---|---|---|
| 8,929,684 B2 * | 1/2015 | Takei | G06F 16/00 382/282 |
| 9,081,064 B2 * | 7/2015 | Whetsel | G01R 31/2884 |
| 9,513,330 B2 * | 12/2016 | Vukic | G01R 31/2853 |
| 9,891,261 B2 * | 2/2018 | Chen | H01L 22/34 |
| 9,966,318 B1 * | 5/2018 | Pagani | G01R 31/2853 |
| 11,393,790 B2 * | 7/2022 | Hiscock | G11C 29/4401 |
| 11,621,202 B2 * | 4/2023 | Li | H01L 22/20 257/48 |

\* cited by examiner

*Primary Examiner* — David A Zarneke
(74) *Attorney, Agent, or Firm* — FOLEY & LARDNER LLP

(57) ABSTRACT

One aspect of this description relates to a testing apparatus including an advance process control monitor (APCM) in a first wafer, a plurality of pads disposed over and coupled to the APCM. The plurality of pads are in a second wafer. The testing apparatus includes a testing unit disposed between the first wafer and the second wafer. The testing unit is coupled to the APCM. The testing unit includes a metal structure within a dielectric. The testing apparatus includes a plurality of through silicon vias (TSVs) extending in a first direction from the first wafer, through the dielectric of the testing unit, to the second wafer.

20 Claims, 11 Drawing Sheets

SYSTEM AND METHOD FOR MEASURING DEVICE INSIDE THROUGH-SILICON VIA SURROUNDINGS

BACKGROUND

The semiconductor integrated circuit (IC) industry has experienced rapid growth. Technological advances in IC materials and design have produced generations of ICs where each generation has smaller and more complex circuits than the previous generation. The fabrication of semiconductor devices may involve one or more testing processes. On-chip structures may be used to carry out the testing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
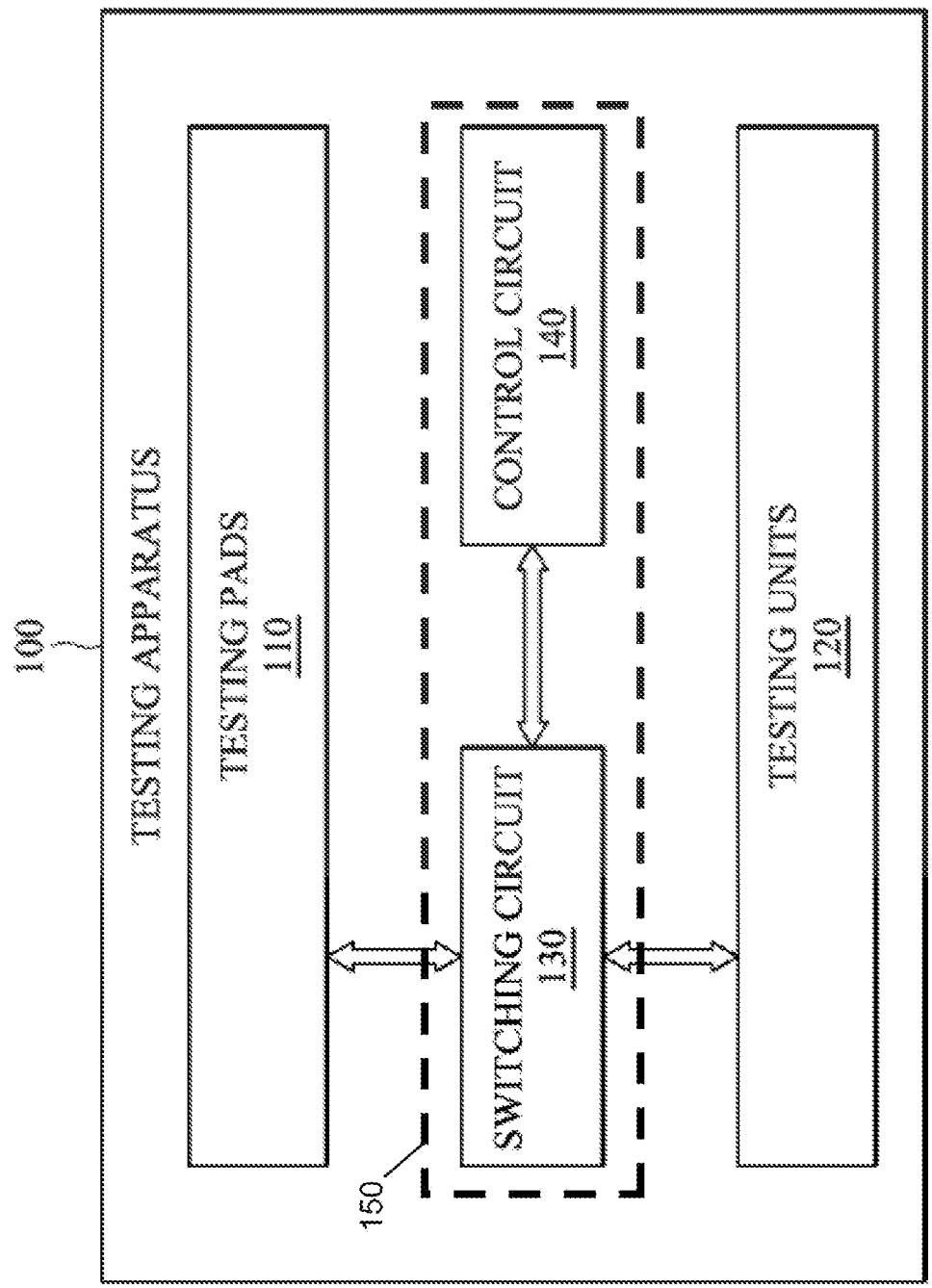
FIG. 1 is a block diagram of a testing apparatus, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One of the goals in fabrication of electronic components is to minimize the size of various components. One way of making the circuits smaller is to stack the chips using through-silicon vias (TSVs). TSVs extend through the substrate thereby electrically interconnecting circuits on various chips. One of the challenges of stacking chips arises due to deleterious effects that TSVs may produce on metal structures in the chips. One such effect arises due to the strain that may result from the formation of the TSVs. The strain from these TSVs may cause significant variation or systematic degradation to metal structures in across randomized locations on a wafer. Accordingly, it is desirable to continuously monitor the quality of the fabrication process.

A plurality of test units and test pads may be used to carry out wafer process testing for tracking defects due to the strain of TSVs. For traditional testing methods, the available number of test units is constrained by the available number of test pads. As semiconductor device continue to shrink, available space on a wafer becomes a valuable resource. As a result, the number of test pads on the wafer may be limited due to chip area consumption concerns, and that in turn limits the number of test units that can be implemented. As IC technologies continue to advance, it is desirable to test a sufficient number of test units to effectively and efficiently monitor degradations due to TSV surroundings.

Disclosed herein is a testing apparatus that can test metal structures surrounded by TSVs and monitor process defects in the metal structures across various locations on a die, a wafer, or stacked dies or wafers. The testing apparatus includes a plurality of testing units, a plurality of pads, and an advance process control monitor (APCM) to selectively couple some of the plurality of pads to at least a different one of the plurality of testing units per clock cycle. Each testing unit includes a metal structure to be tested and a plurality of TSVs surrounding and separated from the testing unit. In some embodiments, the TSVs extend from a first wafer to a second wafer. In some embodiments, the plurality of pads and the APCM are placed on scribe lines between adjacent dies and the testing units are placed in metallization layers in between the first and second wafers. TSV density can be varied across a die, wafer, or stacked dies or wafers in order to test different amounts of strain caused by the TSVs. Metal structures can be characterized with resistance, leakage current, capacitance, inductance, and the like.

Referring to FIG. 1, a block diagram of a testing apparatus 100 is illustrated, in accordance with some embodiments. The testing apparatus (e.g., testing structure) includes a plurality of testing pads 110, a plurality of testing units (e.g., test units, test structures, devices under test, DUTs) 120, a switching circuit/circuitry 130, and a control circuit/circuitry 140. The switching circuit 130 and a control circuit 140 are collectively referred to as an advanced process control monitor (APCM) 150. APCM 150 can also be referred to as PCM 150 or testing unit selection circuitry 150.

The testing pads 110 include a plurality of conductive testing pads, through each of which a test signal can be applied. The test signal may be an electrical current or an electrical voltage. The testing units 120 include a plurality of test units that are designed and implemented for the testing of semiconductor circuit elements or components. For example, a testing unit may include one or more metals having a resistance, a capacitance, an inductance, etc. Each of the testing units 120 includes one or more terminals for electrically coupling with other devices.

The testing pads 110 and the testing units 120 are coupled together by the switching circuit 130. The switching circuit 130 contains a plurality of switching devices that can be selectively activated and deactivated (turned on and off, or closed and opened). The switching devices are each coupled to a respective one of the terminals of the testing units. The operation of the switching circuit 130 is electrically coupled to and controlled by the control circuit 140. The control circuit 140 includes devices that can selectively activate the switching devices. In an embodiment, the control circuit 140 includes a plurality of flip-flop devices as the control devices (e.g., a shift register).

Figure 2:
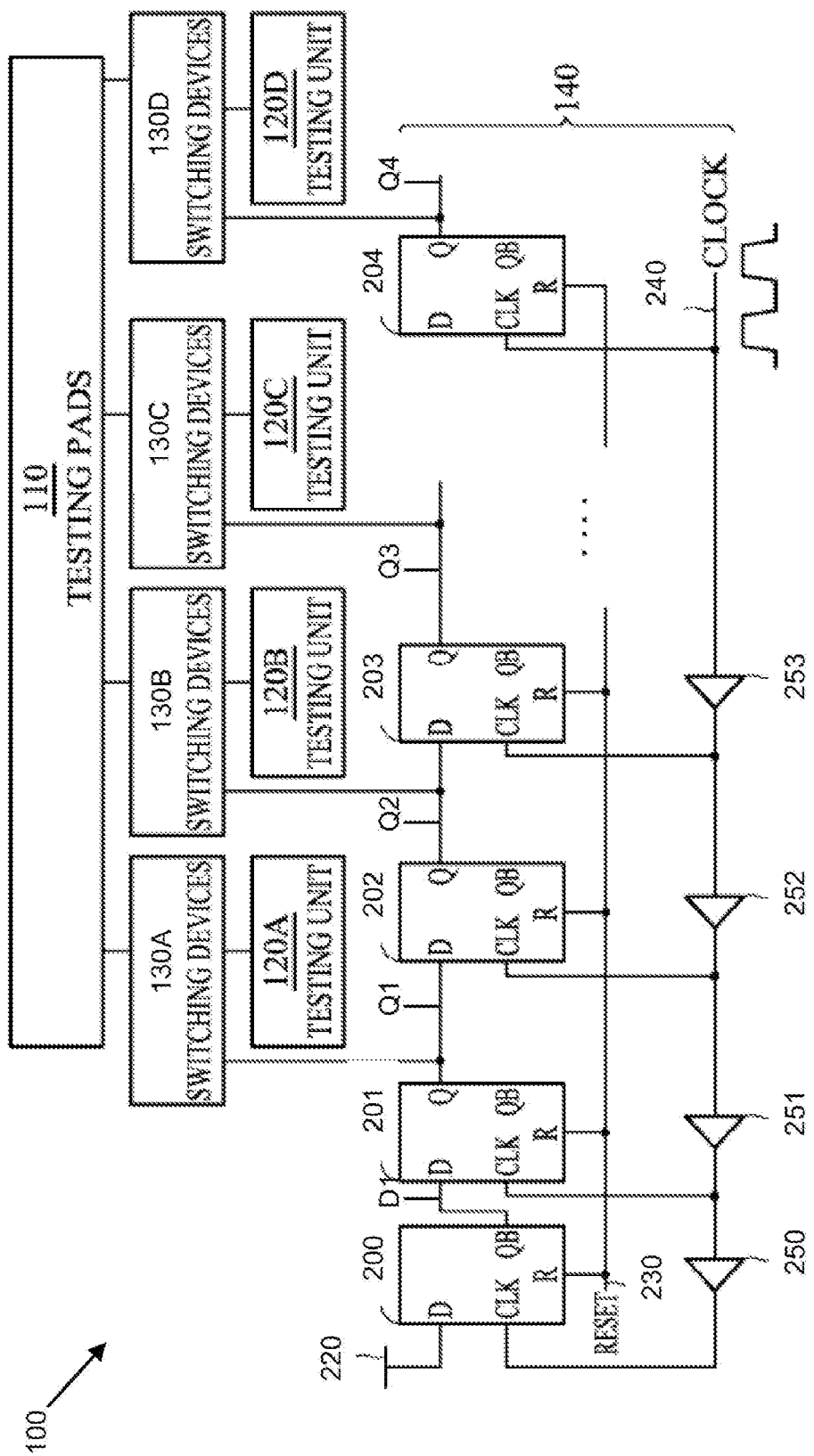
FIG. 2 is an example circuit diagram of the control circuit, in accordance with some embodiments.

FIG. 2 illustrates an example circuit diagram of the control circuit 140, in accordance with some embodiments of the present disclosure. The circuit diagram of the control circuit 140 is shown as part of a block diagram of the testing apparatus 100 of FIG. 1. The control circuit 140 contains a plurality of storage elements, some of which are illustrated herein as storage elements 200-204. The storage elements 200-204 can store a state, such as a logical high (1) state or a logical low (0) state. In the embodiment shown, the storage elements 200-204 are implemented with flip-flop devices such as D (data) flip-flop devices. The flip-flop devices each have a D input, a CLK (clock) input, an R (reset) input, a Q output, and a QB output (opposite of the Q output). For example, the input of 201 is D1, the output of 201 is Q1, the output of 202 is Q2, the output of 203 is Q3, and the output of 204 is Q4. The flip-flop devices 200-204 are coupled together in series. The flip-flop device 200 has its D input coupled to a signal source 220. In some embodiments, the signal source 220 outputs a logic high signal (1). For example, the signal source 220 may be tied to a power-rail such as Vdd or Vss. In other embodiments, the signal source 220 can be selectable as a logic high signal or logic low signal. The QB output of the flip-flop device 200 is coupled to the D input of the flip-flop device 201, but for the rest of the flip-flop devices 201-204, each preceding flip-flop device has its Q output coupled to the D input of the subsequent flip-flop device. As an example, the flip-flop device 201 (the preceding flip-flop device in this example) has its Q output coupled to the D input of the flip-flop device 202 (the subsequent flip-flop device in this example).

The flip-flop devices 200-204 also each have their R input coupled to a reset signal 230. When the reset signal 230 is actuated, all the flip-flop devices 200-204 are reset. The flip flop devices 200-204 also each have their CLK input coupled to a clock signal 240. In some embodiments, a plurality of buffers 250-253 are used to buffer the clock signal 240 before the clock signal is received by the CLK input of the flip-flop devices 200-203. The Q outputs of flip-flop devices 201-204 are coupled to switching devices 130A-130D, respectively. In some embodiments, the switching devices 130A-130D comprise at least one of a transmission gate, an n-type metal-oxide-semiconductor (NMOS) pass gate, or a p-type metal-oxide-semiconductor (PMOS) pass gate. In some embodiments, the switching devices 130A-130D coupling to voltages greater than a predetermined threshold comprise PMOS pass gates, and, the switching devices 130A-130D coupling to voltages lower than a predetermined threshold comprise NMOS pass gates.

The switching devices 130A-130D are respectively coupled between testing units 120A-120D and a subset of testing pads 110. In other words, the testing units 120A-120D "share" the subset of testing pads 110, but not at the same time. Electrical connections may be established between the subset of the testing pads 110 and a particular one of the testing units 120A-120D if the switching devices for that testing unit are activated.

For example, electrical connections may be established between the testing pads 110 and the testing unit 120A if the switching devices 130A are activated (turned on) while the switching devices 130B-130D are deactivated (turned off). Meanwhile, since the switching devices 130B-130D are deactivated, no electrical connections are established between the testing units 120B-120D and the testing pads 110. It is understood that if the switching devices are transmission gates, an inverter may also be coupled to the Q output of the respective flip-flop device, so that logically-complementary control signals may be provided to the transmission gates from that flip-flop device.

The flip-flop devices 201-204 disclosed herein are configured to turn on one set of switching devices at a time (according to clock pulses), so as to activate only one testing unit at any given time. Thus, electrical connections between that testing unit and at least a subset of testing pads is established, while no electrical connections exist between the rest of the testing units and that subset of testing pads. Electrical testing may be done to that testing unit at that time by applying testing signals through the testing pads. This configuration allows the number of testing pads to remain at a fixable low number, even as the number of testing units increases.

It is understood that a plurality of additional flip-flop devices (and the corresponding Switching devices and testing units) exist between the flip-flop devices 203 and 204, but they are not illustrated herein for the sake of simplicity. It is also understood that in alternative embodiments, other Suitable digital circuit devices may be used to implement the storage elements 200-204, for example SR (set-reset) flip flops, JK flip-flops, or latches. It is understood that FIGS. 1-2 are merely one implementation of the APCM 150. In some embodiments, the APCM 150 may be implemented by any arrangement of software, firmware, or hardware that is suitable for APCM operation.

Figure 3:
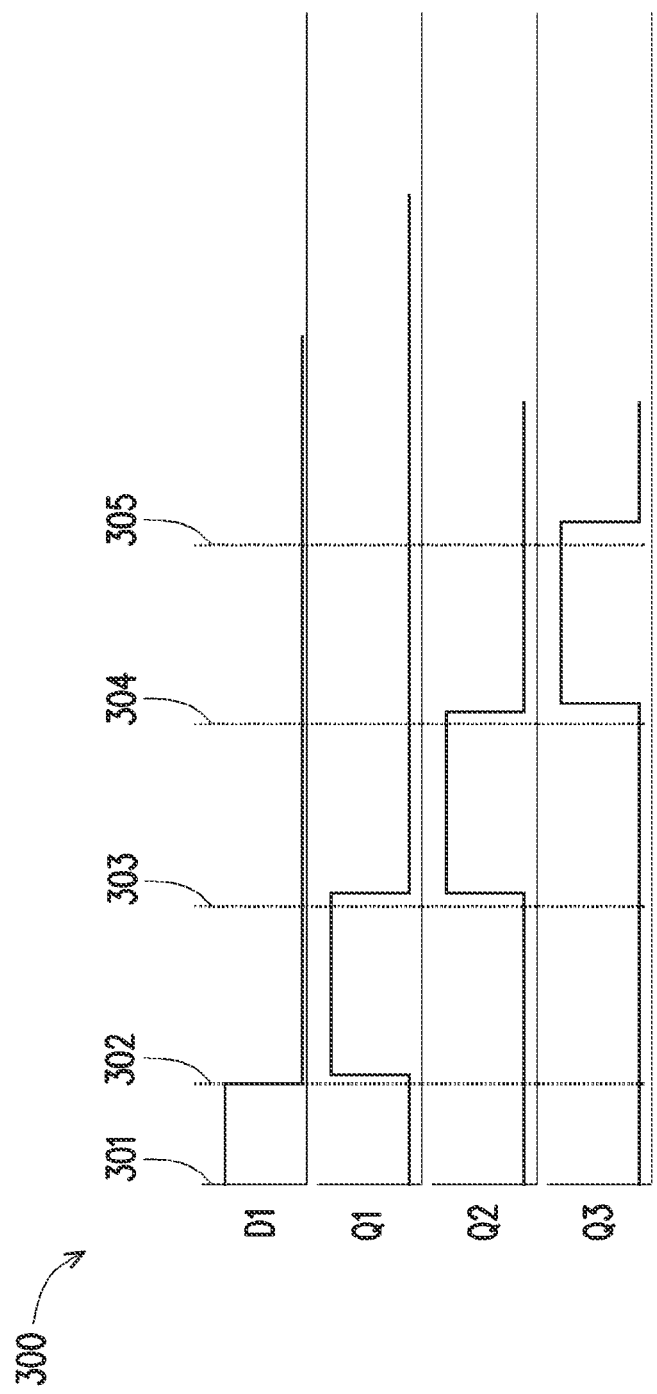
FIG. 3 is an example timing diagram, in accordance with some embodiments.

FIG. 3 is an example timing diagram 300, in accordance with some embodiments. The timing diagram 300 illustrates an example of how the control circuit 140 operates. During a first clock cycle, at time 301, the input D1 of the flip-flop device 201 goes high. During a second clock cycle, at time 302, the flip-flop device 201 outputs a logical high control signal at its Q1 output. This logical high control signal activates the switching devices 130A, which allows the testing unit 120A to be electrically coupled to the testing pads 110. Meanwhile, the other flip-flop devices 202-204 output a logical low during this clock pulse, which means that the switching devices 130B-130D are turned off. Consequently, testing units 120B-120D are not activated and have no electrical connections with the testing pads 110 at this time.

During a third clock cycle, at time 303, the flip-flop device 202 outputs a logical high at its Q2 output and activates the switching devices 130B. This allows electrical connections to be established between the testing unit 120B and the testing pads 110. Meanwhile, the flip-flop devices 201 and 203-204 output a logical low and deactivates the switching devices 130A and 130C-130D. Thus, no electrical connections exist between the testing pads 110 and the testing units 120A and 120C-120D.

During a fourth clock cycle, at time 304, the flip-flop device 203 outputs a logical high at its Q3 output and activates the switching devices 130C. This allows electrical connections to be established between the testing unit 120C and the testing pads 110. Meanwhile, the flip-flop devices 201-202 and 204 output a logical low and deactivates the switching devices 130A-130B and 130D. Thus, no electrical connections exist between the testing pads 110 and the testing units 120A and 120C-120D.

In this manner, during each clock cycle, a different one of the testing units is activated (through the set of switching devices coupled thereto) and is allowed access to the testing pads 110.

Figure 4A:
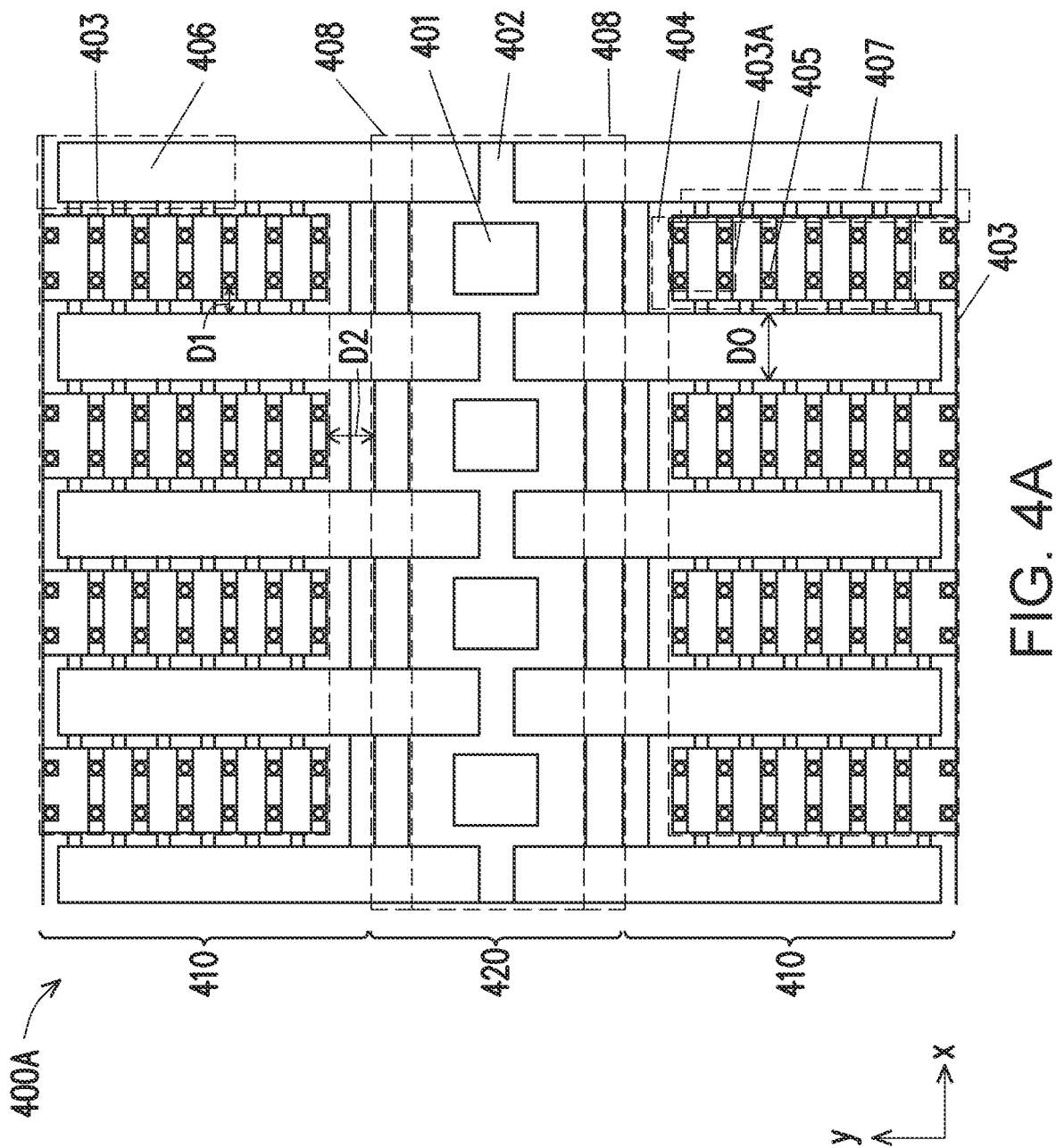
FIG. 4A is an example layout, in accordance with some embodiments.

FIG. 4A is an example layout 400A of the testing apparatus 100, in accordance with some embodiments. The layout 400A includes one or more die portions 410 and a scribe line portion 420 disposed between (e.g., adjacent to) the one or more die portions 410. As shown in the example layout 400A, the scribe line portion 420 extends in a first direction (e.g., the X direction). The scribe line portion 420 includes a plurality of testing pad features 401 arranged in a row along the first direction. Each of testing pad features 401 define one of the testing pads 110 of FIG. 1. In some embodiments, the plurality of testing pad features 401 are in a metal layer such as metal layer 8 (M8). The scribe line portion 420 includes an APCM feature 402. The APCM feature 402 defines the APCM 150 of FIG. 1.

As shown in the example layout 400A, one of the die portions 410 is adjacent to the scribe line portion 420 in a second direction (e.g., the Y direction) perpendicular to the first direction and a second one of the die portions 410 is adjacent to the scribe line portion 420 in a third direction opposite to the second direction. Each die portion 410 includes a plurality of testing unit features 403 such as testing unit feature 403A. Each of the plurality of testing unit features 403 define one of the testing units 120, which is described in more detail with respect to FIGS. 4B-8. In some embodiments, the plurality of testing unit features 403 in each die portion 410 are arranged in columns of testing unit features 404 extending in the second direction and separated from each other in the first direction. In some embodiments, one of the columns 404 is separated from a nearest column 404 by a distance D0. The distance D0 can be optimized for a desired testing unit density.

Each of the plurality of testing unit features 403 include a plurality of through-silicon via (TSV) features 405. The TSV feature 405 defines a TSV structure (e.g., TSV). In some embodiments, each of the plurality of testing unit features 403 includes 4 TSV features 405 but is not limited to 4 TSV features (e.g., may include greater than or less than 4 TSV features). In some embodiments, two adjacent ones of the plurality of the plurality of testing unit features 403 may overlap and share a subset of the plurality of TSV features 405 (e.g., 2 TSV features 405).

The example layout 400A includes first metal features 406 extending in the second direction and coupling the APCM feature 402 to the plurality of test unit features 403 (e.g., via the second metal features 407). The first metal features 406 define a first metal structure. In some embodiments, a first portion of the first metal features 406 carrying sense signals and leakage signals may be on one metal layer such as metal layer 6 (M6) or metal layer (M7) (e.g., two or one layer below the layer of the testing pad features 401, respectively) of the first wafer and may have a width of 0.05 micrometers (um) to 0.1 um. In some embodiments, a second portion of the first metal features 406 carrying force signals may be on two metal layers (e.g., M6 and M7) of the first wafer and may have a width of 0.15 um to 0.25 um. In some embodiments, the first metal features 406 are separated from the nearest ones of the plurality of testing unit features 403 (e.g., the nearest ones of the plurality of TSV features 405) by a distance D1. In some embodiments, the distance D1 is within a range of 4 um to 8 um.

The example layout 400A includes second metal features 407 extending in the first direction and coupling the APCM feature 402 to the first metal features 406. The second metal features 407 define a second metal structure. In some embodiments, the second metal features 407 are on one metal layer (e.g., M6) and have a width of 0.15 um to 0.25 um.

The example layout 400A includes third metal features 408 extending in the first direction and coupling the APCM feature 402 to power supplies (e.g., power sources). The third metal features 408 define a third metal structure. In some embodiments, the third metal features 408 may be on one or more metal layers such as metal layer 0 (M0), metal layer 1 (M1), and metal layer 2 (M2) of the first wafer and may have a width of 0.25 um to 0.75 um. In some embodiments, the third metal features 408 are separated from the nearest ones of the plurality of testing unit features 403 (e.g., the nearest ones of the plurality of TSV features 405) by a distance D2. In some embodiments, the distance D2 is within a range of 7.5 um to 12.5 um.

Figure 4B:
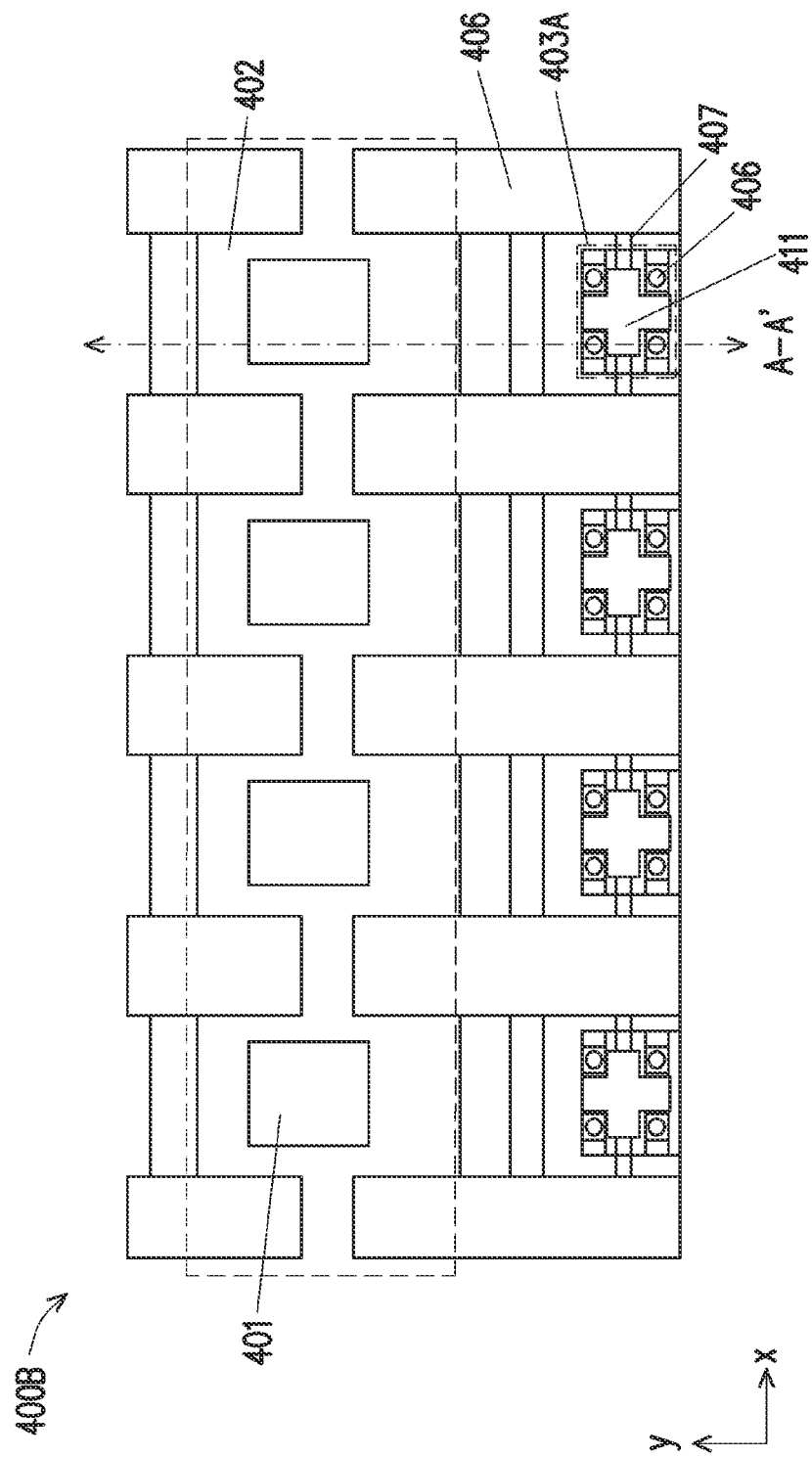
FIG. 4B is an example layout, in accordance with some embodiments.

FIG. 4B is an example layout 400B of the testing apparatus 100, in accordance with some embodiments. FIG. 4B is a portion (e.g., range) of the example layout 400 of FIG. 4A along the second direction and coupled to the third metal features 408. As shown in FIG. 4B, each testing unit feature 403A has a fourth metal feature 411. The fourth metal feature defines a fourth metal structure. In some embodiments, the second metal features 407 are on one metal layer (e.g., M6, the same layer as a layer of the third metal features 408).

Figure 5:
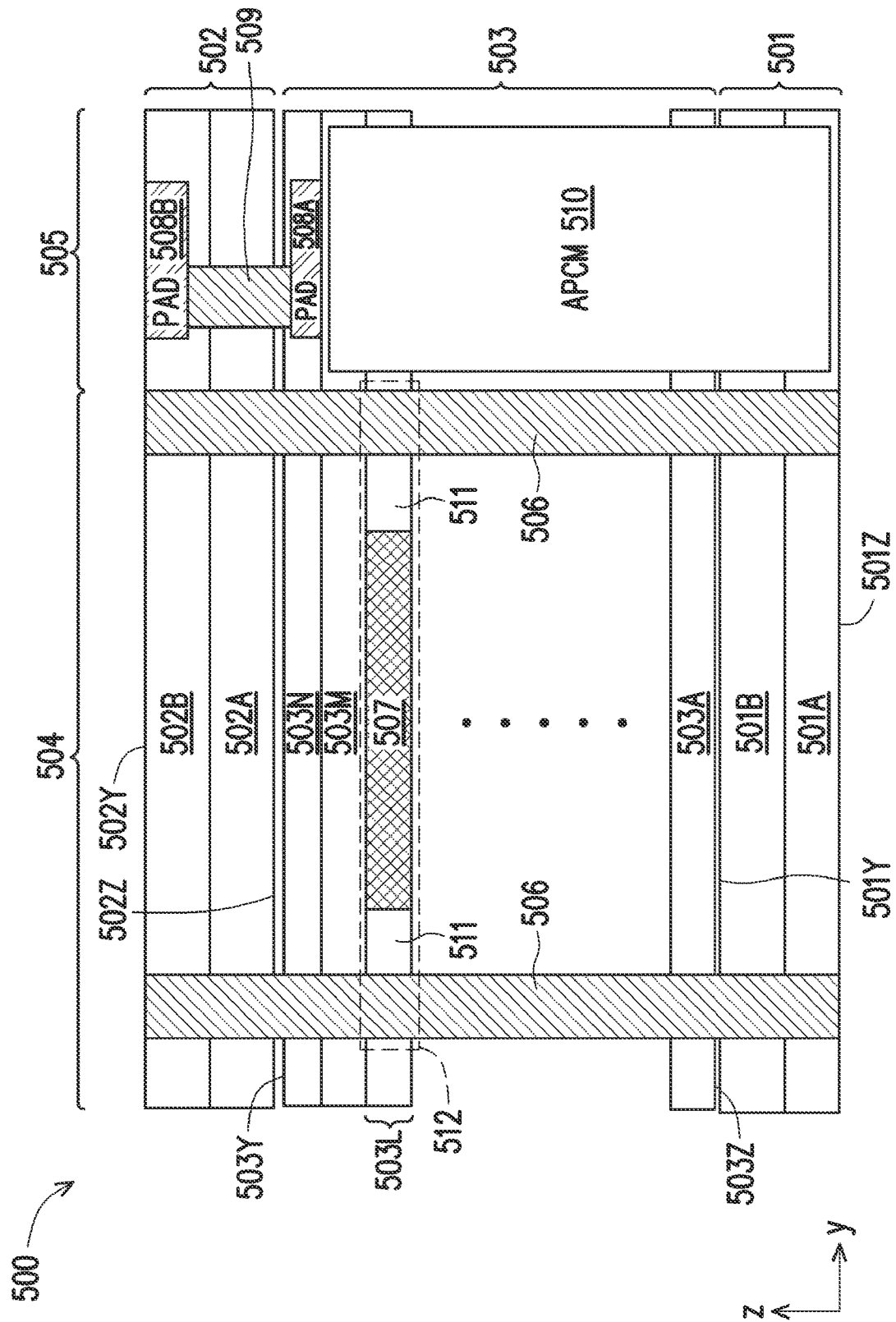
FIG. 5 is an example cross-sectional view of a portion of the testing apparatus, in accordance with some embodiments.

FIG. 5 is an example cross-sectional view of a portion of the testing apparatus cut along line A-A' of FIG. 4B (hereinafter "partial testing apparatus 500"), in accordance with various embodiments.

The partial testing apparatus 500 includes a wafer 501 including a substrate layer 501A and metallization layers 501B formed over the substrate layer 501A. The wafer 501 includes an upper (e.g., top) surface 501Y. In some embodiments, the upper surface 501Y coincides with an upper surface of the metallization layers 501B. The wafer includes a lower (e.g., bottom) surface 501Z. In some embodiments, the lower surface 501Z coincides with a lower surface of the substrate layer 501A.

The partial testing apparatus 500 includes a wafer 502 formed (e.g., placed, disposed, located) over the wafer 501 in the third direction (e.g., the Z direction). The wafer 502 includes a substrate layer 502A and metallization layers 502B formed over the substrate layer 502A. The wafer 502 includes an upper surface 502Y. In some embodiments, the upper surface 502Y coincides with an upper surface of the metallization layers 502B. The wafer 502 includes a lower surface 502Z. In some embodiments, the lower surface 502Y coincides with a lower surface of the substrate layer 502A.

The partial testing apparatus 500 includes metallization layers 503 disposed (e.g., placed, formed, located) in between the wafer 501 and the wafer 502. The metallization layers 503 include a lowest metal layer 503A, intermediate metal layers formed over the lowest metal layer 503A (not shown), and upper most metal layers 503L, 503M, and 503N formed over the intermediate metal layers. The metal layer 503M is formed over the metal layer 503L, and the metal layer 503N is formed over the metal layer 503M. In some embodiments, the metal layer 503A is metal layer 0 (M0), and the metal layers 503L-503N are metal layers M6-M8. The metallization layers 503 include an upper surface 503Y. In some embodiments, the upper surface 503Y coincides with an upper surface of the metal layer 503N. The metallization layers 503 include a lower surface 503Z. In some embodiments, the lower surface 503Y coincides with a lower surface of the metal layer 503A. In some embodiments, the upper surface 503Y coincides with or is adjacent to the lower surface 502Z of the wafer 502. In some embodiments, the lower surface 503Z coincides with or is adjacent to the upper surface 501Y of the wafer 501.

The partial testing apparatus 500 (e.g., each of the layers of the partial testing apparatus 500) has a die portion 504 that extends in the first direction (e.g., the Y direction) and a scribe portion 505 (e.g., a scribe line 505) that extends in the first direction and that abuts with the die portion 504 along the second direction (e.g., the Z direction). After wafer testing, the wafer is diced, thereby removing the scribe portion 505 and leaving the die portion 504 intact.

The die portion 504 of the partial testing apparatus 500 includes a plurality of TSVs 506 that extend from the wafer 501 to the wafer 502. In some embodiments, the plurality of TSVs 506 extend from the lower surface 501Z of the wafer 501 to the upper surface 502Y of the wafer 502. In some embodiments, the TSVs 506 extend to the wafers 501 and 502 and are separated from the surfaces 501Z and 502Y. The plurality of TSVs 506 are defined by the plurality of TSV features 406 cut along the line A-A' in FIG. 4B.

The metallization layers 503 includes a testing unit 512. The testing unit 512 is defined by the testing unit feature 403A cut along the line A-A' in FIG. 4B and is corresponds to one of the testing units 120 of FIG. 1. The testing unit 512 includes a metal structure 507, dielectric 511 on either side of the metal structure 507, and a portion of the TSVs 506 intersecting (e.g. extending) through the dielectric 511 portion of the testing unit 120 in the second direction.

The metal structure 507 is defined by the metal feature 411 cut along the line A-A' in FIG. 4B. The metal structure 507 is described in mfore detail with respect to FIGS. 6-7. The metal structure 507 is separated from the plurality of TSVs 506 in the first direction such that the metal structure 507 is within the die portion 504. In some embodiments, the metal structure 507 surrounds a portion of the plurality of TSVs 506 in the first direction so that the TSVs 506 extend through the metal structure 507 in the second direction. In some embodiments, the metal structure 507 is disposed within the metal layer 503L (e.g., M6). In some embodiments, one or more metal structures 507 are disposed within a plurality of metal layers to test resistance, capacitance, leakage, inductance, etc. For example, a first metal structure 507 (e.g., first metal plate) is disposed within 503L, a second metal structure (e.g., second metal plate) is disposed within 503M, a dielectric layer is formed between the first metal structure, and a capacitance from the first metal structure 507 to the second metal structure is measured. In some embodiments, at least one of the plurality of TSVs 506, the metal structure 507, or the testing unit 512 is disposed within the scribe portion 505.

The scribe portion 505 of the partial testing apparatus 500 includes a pad 508A. In some embodiments, the metal structure 507 is disposed within the metal layer 503N (e.g., M8). The pad 508A can be disposed in any of the metal layers 503, the wafer 501 or the wafer 502. In some embodiments, the pad 508A is disposed between the pad 508B and the APCM 510. In some embodiments, the pad 508A is disposed on a same metal layer occupied by the APCM 510. The scribe portion 505 includes a pad 508B that is disposed within the metallization layers 502B of the wafer 502. In some embodiments, an upper surface of the pad 508B coincides with the upper portion 502Y of the wafer 502. The scribe portion 505 includes a TSV 509 that extends from the pad 508A to the pad 508B. In some embodiments, the APCM 510 extends up all the way to the pad 508B, so that the pad 508A and the TSV 509 are unnecessary. The pads 508A, 508B, and the TSV 509 are defined by the pad feature 401 cut along the line A-A' in FIG. 4B and correspond to one of the testing pads 110 of FIG. 1.

The scribe portion 505 includes an APCM 510 formed, in some embodiments, on the substrate 501A of the wafer 501, the metallization layers 501B of the wafer 501, and one or more of the metallization layers 503 such as metal layers 503A-503M. In some embodiments, the APCM is disposed in one or more of the wafer 501, the metal layers 503, or the wafer 502. The APCM 510 is defined by the APCM feature 402 cut along the line A-A' in FIG. 4B and corresponds to the APCM 150 of FIG. 1. In some embodiments, the pads 508A and 508B are formed over at least part of the APCM 510. In some embodiments, the pads 508A and 508B are at least partially formed over the APCM 510. In some embodiments, at least one of the pads 508A and 508B, the TSV 509, or the APCM 510 is included in the die portion 504.

Figure 6:
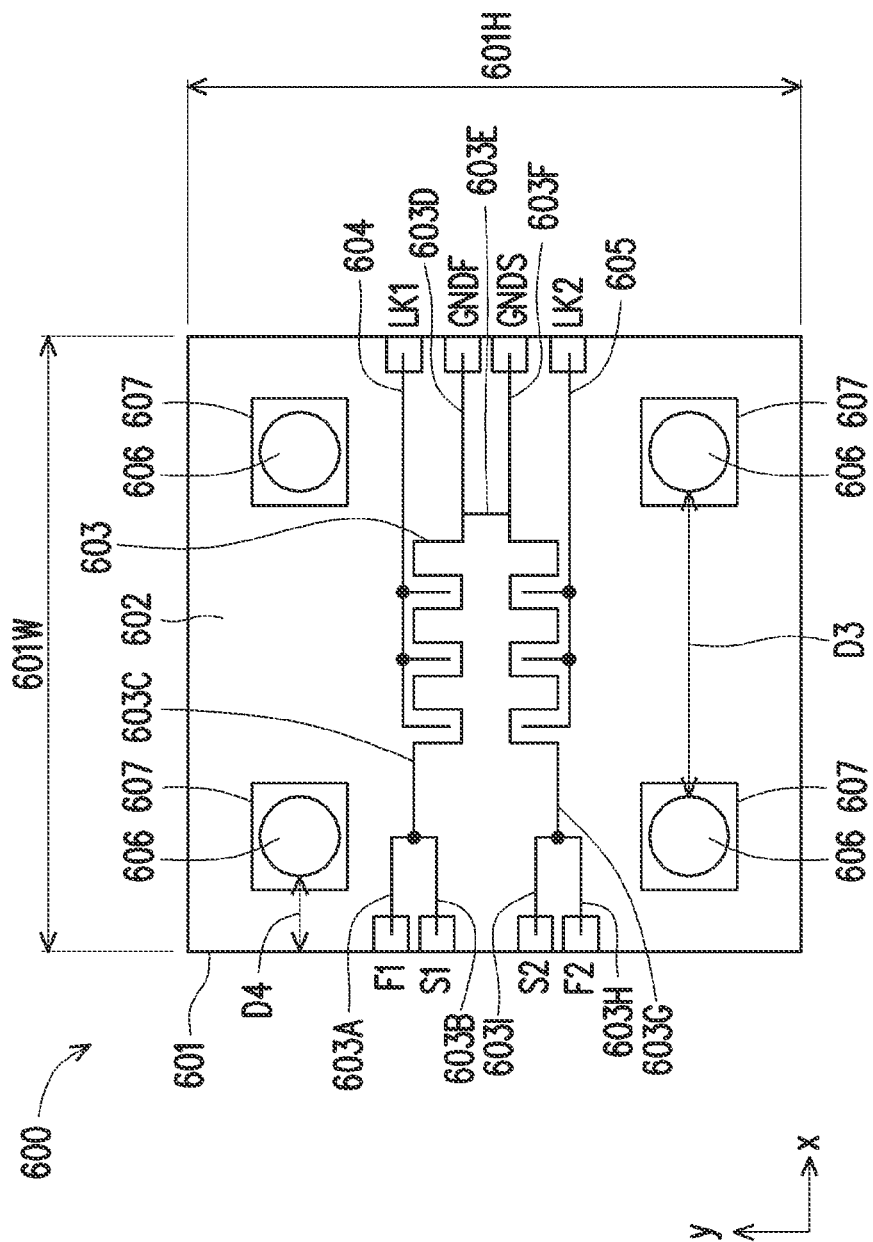
FIG. 6 is an example layout, in accordance with some embodiments.

FIG. 6 is an example layout 600 of one of the testing units 120 (e.g., testing unit cells 120), in accordance with various embodiments. The layout 600 includes a cell boundary 601, a cell width 601W in the first direction (e.g., the X direction), and a cell height 601H in the second direction (e.g., the Y direction). In some embodiments, the cell width 601W and the cell height 601H are within a range of 10 um to 25 um. The layout 600 includes a dielectric feature 602. The dielectric feature 602 defines a dielectric structure.

The layout includes a metal feature 603 disposed within/on the dielectric feature 602. The metal feature 603 defines a metal structure in one metal layer (e.g., M6). The metal feature 603 includes a plurality of metal segment features 603A-603I. The metal segment features 603C and 603G define metal structures for which, for example, a resistance is to be measured. In some embodiments, the metal segment features 603C and 603G extend in the first direction and, in some embodiments, have a snake/serpentine pattern.

The layout includes metal contact features F1 (force 1), S1 (sense 1), F2, S2, GNDF (ground force), and GNDS (ground sense). The metal contact features define metal contacts interfacing between one of the testing units 120 and on-chip routing (e.g., structures associated with third metal features 408). F1, S1, GNDF, and GNDS can be used to perform a four-terminal sense (e.g., kelvin) measurement on a metal structure corresponding to the metal segment feature 603C. In some embodiments, a current applied at F1 which flows to GNDF (e.g., an equal and opposite current is applied at GNDF), and a voltage is measured across S1 and GNDS. The metal segment feature 603A connects F1 to the metal segment feature 603C. The metal segment feature 603B connects S1 to the metal segment feature 603C. The metal segment feature 603D connects GNDF to the metal segment feature 603C. The metal segment feature 603F connects GNDS to the metal segment feature 603C (by way of the metal segment feature 603E. The metal segment feature 603E connects 603C/603D to the metal segment features 603G/603F. This enables GNDF and GNDS to be shared by the metal structures corresponding to metal segment features 603C and 603G for their respective four sensing measurements.

F2, S2, GNDF, and GNDS can be used to perform a four-terminal sense measurement on a metal structure corresponding to the metal segment feature 603G. In some embodiments, a current applied at F2 which flows to GNDF (e.g., an equal and opposite current is applied at GNDF), and a voltage is measured across S2 and GNDS. The metal segment feature 603H connects F2 to the metal segment feature 603G. The metal segment feature 603I connects S2 to the metal segment feature 603G.

The layout includes a metal features 604 and 605 disposed within/on the dielectric feature 602. The metal features 604 and 605 define metal structures in one metal layer (e.g., M6). In some embodiments, the metal feature 604 and 605 extend in the first direction. The metal feature 604 and 605 are separated from each other and the metal feature 603. In some embodiments, the metal feature 604 is adjacent (e.g., the nearest metal) to the metal feature 603 in the second direction and the metal feature 605 is adjacent to the metal feature 603 in a direction opposite from the second direction.

The layout includes metal contact features LK1 (leakage 1) and LK2. LK1 and LK2 can be used to perform leakage measurements. LK1 is coupled to the metal feature 604. In some embodiments, a current applied at F1 and a second current (e.g., a portion of the current applied at F1) flows to GNDF. A third current (e.g., a second portion of the current applied at F1), is measured/sensed at the LK1. LK2 is coupled to the metal feature 605. In some embodiments, a current applied at F2 and a second current (e.g., a portion of the current applied at F2) flows to GNDF. A third current (e.g., a second portion of the current applied at F2), is measured/sensed at the LK2.

The layout includes a plurality of TSV features 606. The plurality of TSV features 606 are instances of the plurality of TSV features 403. The plurality of TSV features 606 define a plurality of TSVs such as the TSV 506 in FIG. 5. Each of the plurality of TSV features 606 are separated from a nearest one of the plurality of TSV features 606 by a distance D3. In some embodiments, D3 is in a range of 5 um to 15 um. In some embodiments, the value for D3 is same for each of the plurality of TSV features 606. In some embodiments, the value for D3 is different for a first TSV feature 606 than for a second TSV feature 606. Each of the plurality of TSV features 606 are separated from the cell boundary 601 by a distance D4. In some embodiments, D4 is in a range of 1.5 um to 4.5 um. The layout includes a keep-out zone (KOZ) around each of the plurality of TSV features 606. The KOZ is a region around each of the plurality of TSV features 606 where metal features (e.g., metal features 603-605) may not be disposed.

In the example layout 600, the testing unit 120 has eight contacts. Each of the eight contacts can be coupled to a corresponding one of the testing pads 110. Each of eight contacts of a second testing unit 120 can be coupled to another corresponding one of the testing pads 110. Six other test pads can be used for operating two shift registers of an APCM (e.g., source signal 1 (S1), source signal 2 (S2), reset, clock, DVDD, DVSS). Thus, two testing units 120 (e.g., two groups of testing units 120 over multiple clock cycles) can simultaneously be tested using a standard 24-contact probe card. In some embodiments, the two testing units 120 are tested in series. In some embodiments, GndF and GndS can be hardwired to a nearby ground. Additional metal features can be added that define additional leakage measurements. A table below summarizes:

| Group | PAD number | Function |
|---|---|---|
| 1 | 1 | Reset |
| 1 | 2 | Lk5 |
| 1 | 3 | Lk3 |
| 1 | 4 | Lk1 |
| 1 | 5 | S1 |
| 1 | 6 | F1 |
| 1 | 7 | F2 |
| 1 | 8 | S2 |
| 1 | 9 | Lk2 |
| 1 | 10 | Lk4 |
| 1 | 11 | S1 |
| 1 | 12 | DVDD |
| 2 | 13 | DVSS |
| 2 | 14 | Lk9 |
| 2 | 15 | Lk7 |
| 2 | 16 | Lk5 |
| 2 | 17 | S3 |
| 2 | 18 | F3 |
| 2 | 19 | F4 |
| 2 | 20 | S4 |
| 2 | 21 | Lk6 |
| 2 | 22 | Lk8 |
| 2 | 23 | S2 |
| 2 | 24 | Clk |

Figure 7:
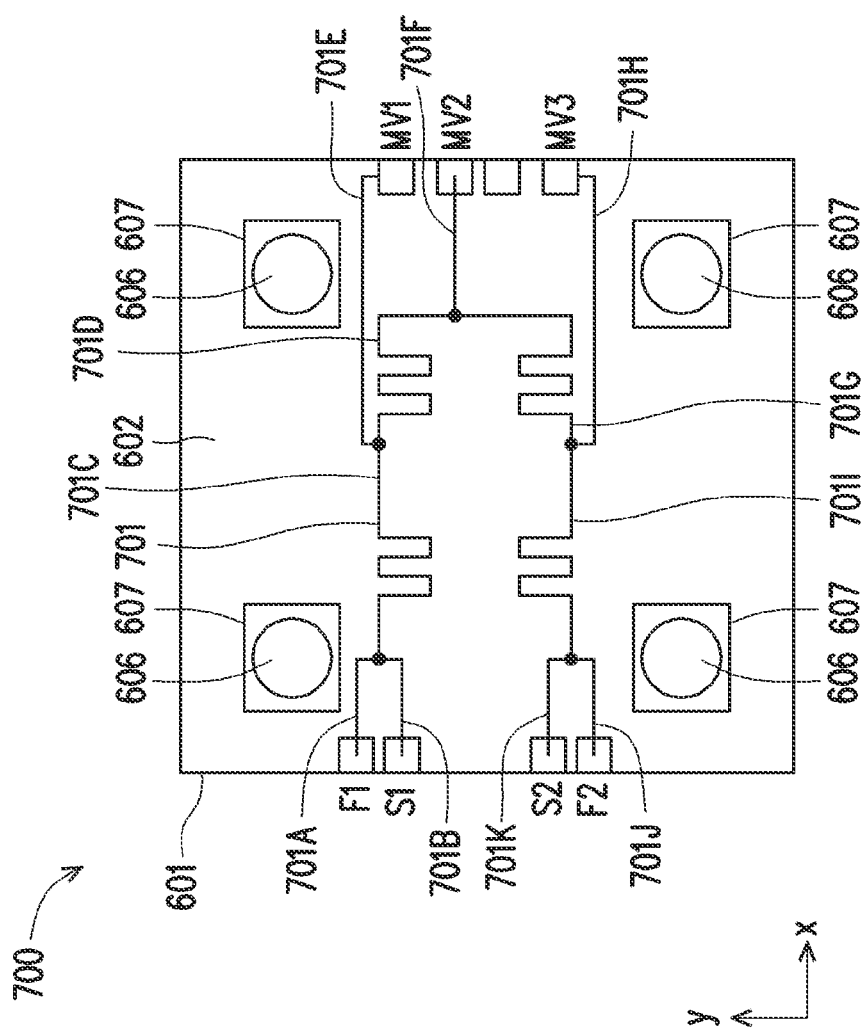
FIG. 7 is an example layout, in accordance with some embodiments.

FIG. 7 is an example layout 700 of one of the testing units 120 (e.g., testing unit cells 120), in accordance with various embodiments. The layout 700 is similar to the layout 600 of FIG. 6 except that the layout 700 has different metal features and metal contact features.

The layout includes a metal feature 701 disposed within/on the dielectric feature 602. The metal feature 701 defines a metal structure in one metal layer (e.g., M6). The metal feature 603 includes a plurality of metal segment features 701A-701K. The metal segment features 701C, 701D, 701G, and 701I define metal structures for which, for example, a resistance is to be measured. In some embodiments, the metal segment features 701C, 701D, 701G, and 701I extend in the first direction and, in some embodiments, have a snake/serpentine pattern.

The layout includes metal contact features F1, S1, F2, S2, MV1 (mid-voltage 1), MV2, and MV3. F1, F2, S1 and MV1 can be used to perform a four-terminal sense (e.g., kelvin) measurement on a metal structure corresponding to the metal segment feature 701C. In some embodiments, a current applied at F1 which flows to F2 (e.g., an equal and opposite current is applied at GNDF), and a voltage is measured across S1 and MV1. The metal segment feature 701A connects F1 to the metal segment feature 701C. The metal segment feature 701B connects S1 to the metal segment feature 701C. The metal segment feature 701J connects F2 to the metal segment feature 701C. The metal segment feature 701E connects MV1 to the metal segment feature 701C (and 701D).

F1, F2, MV1, and MV2 can be used to perform a four-terminal sense measurement on a metal structure corresponding to the metal segment feature 701D. In some embodiments, a current applied at F1 which flows to F2 (e.g., an equal and opposite current is applied at GNDF), and a voltage is measured across MV1 and MV2. The metal segment feature 701F connects MV2 to the metal segment feature 701D (and 701G).

F1, F2, MV2, and MV3 can be used to perform a four-terminal sense measurement on a metal structure corresponding to the metal segment feature 701G. In some embodiments, a current applied at F1 which flows to F2 (e.g., an equal and opposite current is applied at GNDF), and a voltage is measured across MV2 and MV3. The metal segment feature 701H connects MV3 to the metal segment feature 701G (and 701I).

F1, F2, MV3, and S2 can be used to perform a four-terminal sense measurement on a metal structure corresponding to the metal segment feature 701G. In some embodiments, a current applied at F1 which flows to F2 (e.g., an equal and opposite current is applied at GNDF), and a voltage is measured across MV3 and S2. The metal segment feature 701K connects S2 to the metal segment feature 701I.

Figure 8:
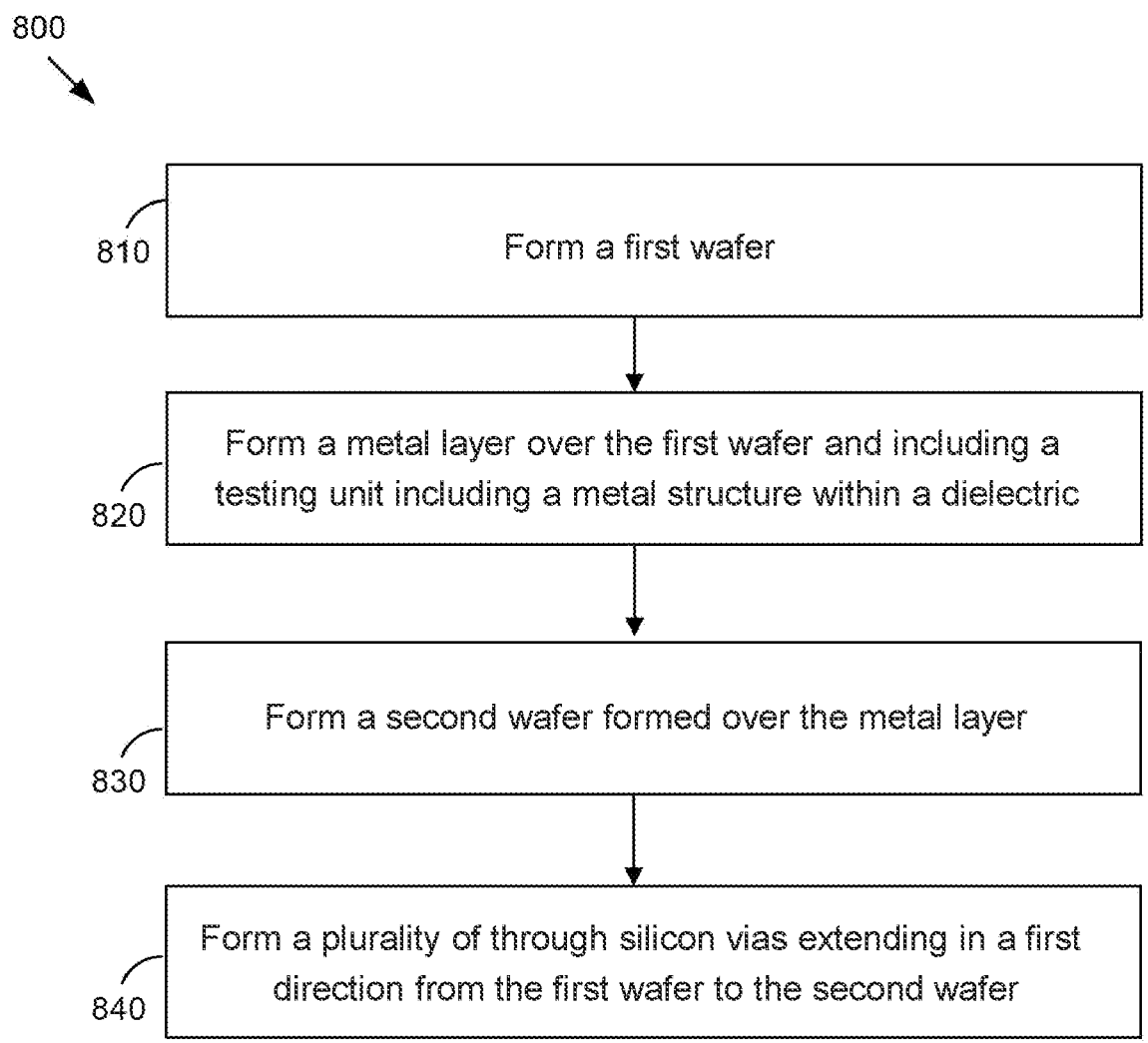
FIG. 8 is a flowchart of a method of forming a testing apparatus, in accordance with some embodiments.

FIG. 8 is a flowchart of a method 800 of forming a testing apparatus, in accordance with some embodiments. In some embodiments, the testing apparatus may be formed in accordance with at least one of the testing apparatus of 100 with respect to FIG. 1, the control circuit 140 with respect to FIG. 2, the cross-sectional view of a portion of the testing apparatus 500 with respect to FIG. 5, or one of the circuit layouts 400A, 400B, 700, and 800 with respect to the FIGS. 4A, 4B, 7, and 8. In some embodiments, some or all of method 800 is executed by a processor of a computer. In some embodiments, some or all of method 800 is executed by a processor 902 of an IC layout diagram generation system 900, discussed below with respect to FIG. 9. Some or all of the operations of method 800 are capable of being performed as part of a design procedure performed in a design house, e.g., a design house 1020 discussed below with respect to FIG. 10.

In some embodiments, the operations of method 800 are performed in the order depicted in FIG. 8. In some embodiments, the operations of method 800 are performed simultaneously and/or in an order other than the order depicted in FIG. 8. In some embodiments, one or more operations are performed before, between, during, and/or after performing one or more operations of method 800.

At operation 810, the processor forms a first wafer. In some embodiments, the first wafer comprises an advance process control monitor (APCM). At operation 820, the processor forms a metal layer over the first wafer and comprising a testing unit comprising a metal structure within a dielectric. In some embodiments, the testing unit is coupled to the APCM. At operation 830, the processor forms a second wafer formed over the metal layer. In some embodiments, the second wafer comprises a plurality of pads formed over and coupled to the APCM. At operation 840, the processor forms a plurality of through silicon vias (TSVs) extending in a first direction (e.g., the Z direction) from the first wafer, through the dielectric of the metal layer, to the second wafer. In some embodiments, the testing apparatus comprises a die portion extending in a second direction perpendicular to the first direction and a scribe portion abutted with the die portion along the first direction. In some embodiments, the metal structure is located in the die portion and the APCM and the plurality of pads are located in the scribe portion.

Figure 9:
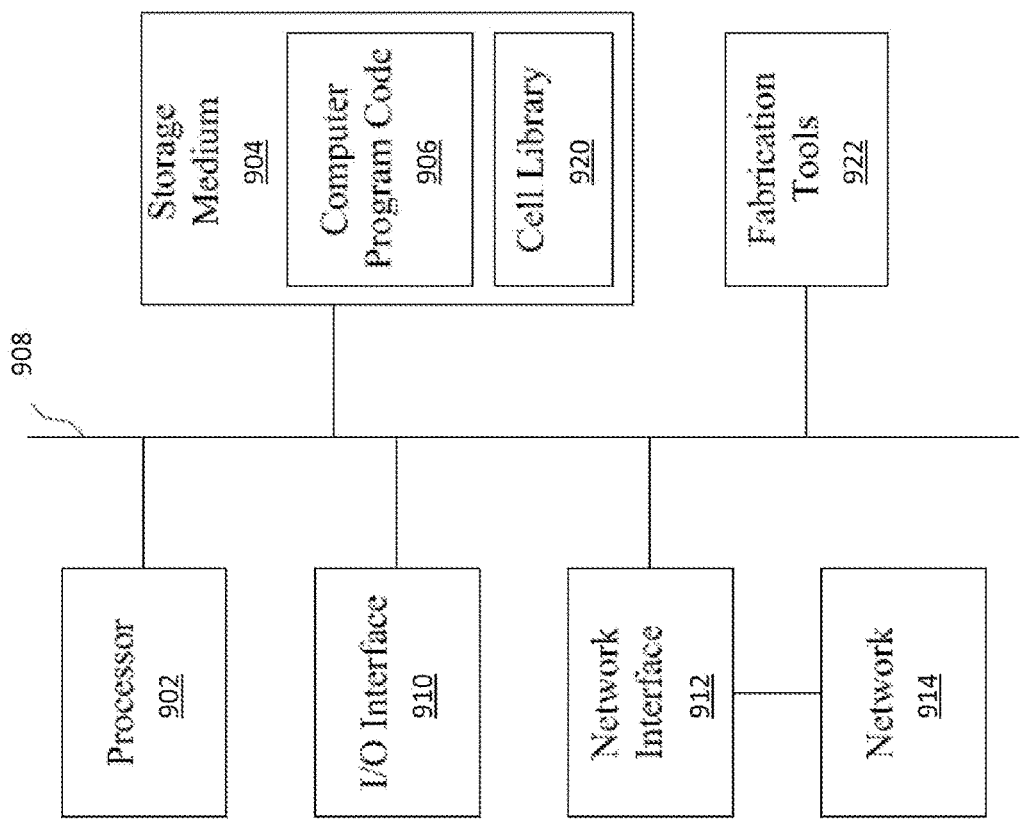
FIG. 9 is a block diagram of IC layout diagram generation system, in accordance with some embodiments.

FIG. 9 is a block diagram of IC layout diagram generation system 900, in accordance with some embodiments. In some embodiments, IC layout diagram generation system 900 includes an electronic design automation (EDA). In some embodiments, IC layout diagram generation system 900 includes or is part of an APR system. Methods described herein of designing IC layout diagrams representing fin arrangements, in accordance with one or more embodiments, are implementable, for example, IC layout diagram generation system 900, in accordance with some embodiments.

In some embodiments, IC layout diagram generation system 900 is a general purpose computing device including processor 902 and a non-transitory, computer-readable storage medium 904. Computer-readable storage medium 904, amongst other things, is encoded with, i.e., stores, computer program code 906, i.e., a set of executable instructions. Execution of instructions 906 by processor 902 represents (at least in part) an IC layout diagram generation tool which can be used to generate or implement circuit layouts 400A, 400B, 700, and 800 discussed above with respect to FIGS. 4A, 4B, 7, and 8 (hereinafter, the noted processes and/or methods).

Processor 902 is electrically coupled to computer-readable storage medium 904 via a bus 908. Processor 902 is also electrically coupled to an I/O interface 910 by bus 908. A network interface 912 is also electrically connected to processor 902 via bus 908. Network interface 912 is connected to a network 914, so that processor 902 and computer-readable storage medium 904 are capable of connecting to external elements via network 914. Processor 902 is configured to execute computer program code 906 encoded in computer-readable storage medium 904 in order to cause IC layout diagram generation system 900 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, computer-readable storage medium 904 stores computer program code 906 configured to cause IC layout diagram generation system 900 (where such execution represents (at least in part) the IC layout diagram generation tool) to be usable for performing a portion or all of the noted processes and/or methods. In one or more embodiments, computer-readable storage medium 904 also stores information which facilitates performing a portion or all of the noted processes and/or methods. In one or more embodiments, computer-readable storage medium 904 stores library 920 of standard cells including IC layout diagrams as disclosed herein, e.g., one or more of the circuit layouts 400A, 400B, 700, and 800 discussed above with respect to FIGS. 4A, 4B, 7, and 8.

IC layout diagram generation system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

IC layout diagram generation system 900 also includes network interface 912 coupled to processor 902. Network interface 912 allows IC layout diagram generation system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more IC layout diagram generation systems 900.

IC layout diagram generation system 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. IC layout diagram generation system 900 is configured to receive information related to a user interface (UI) through I/O interface 910.

In some embodiments, the system 900 may also be associated with various fabrication tools 922. Among other things, the fabrication tools 922 may be used to prepare and fabricate a set of masks based on the standard cell layout created by a standard cell layout application. The set of masks may define the geometry for the photolithography steps used during semiconductor fabrication of the circuit.

To prepare a set of masks, the fabrication tools 922 may be used to translate the standard cell layout of the circuit into a representative data file ("RDF"). The RDF may then be used to fabricate a set of physical masks to fabricate the circuit.

In some embodiments, preparing the set of masks may include performing an optical proximity correction (OPC) using lithography enhancement techniques to compensate for image errors, such as those that can arise from diffraction, interference, other process effects and the like, in the standard cell layout. In some embodiments, a mask rule checker (MRC) of the fabrication tools 922 may check the standard cell layout that has undergone processes in OPC with a set of mask creation rules. The mask creation rules may contain certain geometric and/or connectivity restrictions to ensure sufficient margins, to account for variability in semiconductor manufacturing processes, and the like. In some embodiments, the MRC may modify the standard cell layout to compensate for limitations during the fabrication of the set of masks. In some embodiments, preparing the set of masks may also include resolution enhancement techniques (RET), such as off-axis illumination, sub-resolution assist features, phase-shifting masks, other suitable techniques, and the like or combinations thereof.

The preparation of the set of masks may further include, in some embodiments, lithography process checking (LPC) that may simulate processes implemented to fabricate the circuit. LPC may simulate these processes based on the standard cell layout to create a simulated manufactured device of the circuit. LPC may take into account various factors, such as aerial image contrast, depth of focus ("DOF"), mask error enhancement factor ("MEEF"), other suitable factors, and the like or combinations thereof, to simulate the fabrication of the circuit. In some embodiments, after a simulated manufactured device has been created by LPC, if the simulated device does not satisfy certain design rules, OPC and/or MRC may be repeated to further refine the standard cell layout.

To fabricate the set of masks, a mask writer may convert the RDF to an image on a substrate, such as a mask (reticle) or a semiconductor wafer. In some embodiments, an electron-beam (e-beam) or a mechanism of multiple e-beams may be used to form a mask pattern on a semiconductor wafer to form the mask. In some embodiments, the mask pattern may include one or more opaque regions and one or more transparent regions. A radiation beam, such as an ultraviolet (UV) beam, used to expose the image sensitive material layer (e.g., photoresist) which has been coated on the semiconductor wafer, may be blocked by the opaque regions and transmits through the transparent regions. In one example, the mask pattern may include a transparent substrate (e.g., fused quartz) and an opaque material (e.g., chromium) coated in the opaque regions to form the mask. In other embodiments, other or additional techniques may be used to fabricate the masks.

Once the masks are fabricated, a fabrication entity (e.g., a manufacturing facility or semiconductor foundry) may use the fabricated masks to fabricate the circuit. In some embodiments, fabricating the circuit may involve depositing one or material in/on a semiconductor wafer using the mask (or masks). The semiconductor wafer may include a silicon substrate or other substrate having material layers formed thereon. The semiconductor wafer may further include one or more of various doped regions, dielectric features, multilevel interconnects, and the like formed using one or more of the masks.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by IC layout diagram generation system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 10:
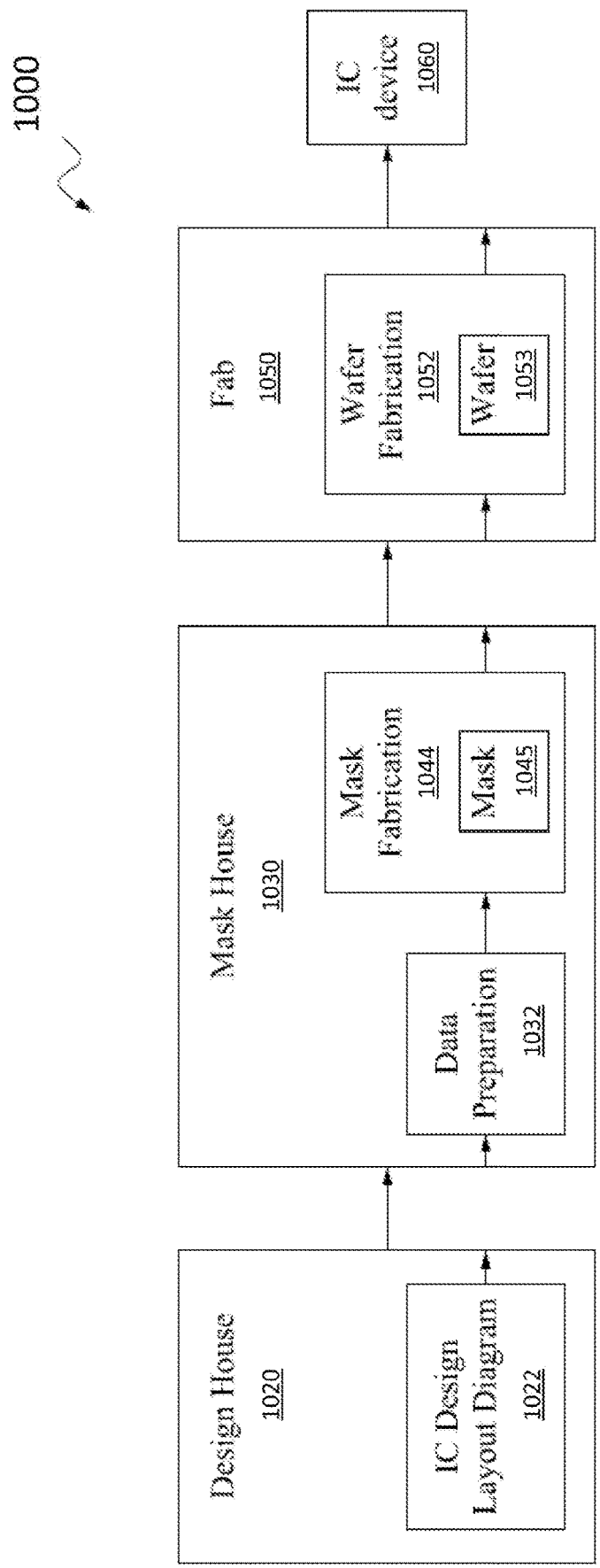
FIG. 10 is a block diagram of IC manufacturing system, and an IC manufacturing flow associated therewith, in accordance with some embodiments.

FIG. 10 is a block diagram of IC manufacturing system 1000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1000.

In FIG. 10, IC manufacturing system 1000 includes entities, such as a design house 1020, a mask house 1030, and an IC manufacturer/fabricator ("fab") 1050, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single larger company. In some embodiments, two or more of design house 1020, mask house 1030, and IC fab 1050 coexist in a common facility and use common resources.

Design house (or design team) 1020 generates an IC design layout diagram 1022. IC design layout diagram 1022 includes various geometrical patterns, e.g., one or more of the circuit layouts 400A, 400B, 700, and 800 discussed above with respect to FIGS. 4A, 4B, 7, and 8, designed for an IC (e.g., 3DIC) device 1060, e.g., the testing apparatus of 100 discussed above with respect to FIG. 1, the control circuit 140 discussed above with respect to FIG. 2, the cross-sectional view of a portion of the testing apparatus 500 discussed above with respect to FIG. 5. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC design layout diagram 1022. The design procedure includes one or more of logic design, physical design, or place and route. IC design layout diagram 1022 is presented in one or more data files having information of the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060 according to IC design layout diagram 1022. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The design layout diagram 1022 is manipulated by mask data preparation 1032 to comply with particular characteristics of the mask writer and/or requirements of IC fab 1050. In FIG. 10, mask data preparation 1032 and mask fabrication 1044 are illustrated as separate elements. In some embodiments, mask data preparation 1032 and mask fabrication 1044 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout diagram 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for limitations during mask fabrication 1044, which may undo part of the modifications performed by OPC in order to meet mask creation rules.

In some embodiments, mask data preparation 1032 includes lithography process checking (LPC) that simulates processing that will be implemented by IC fab 1050 to fabricate IC device 1060. LPC simulates this processing based on IC design layout diagram 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1022.

It should be understood that the above description of mask data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to IC design layout diagram 1022 during data preparation 1032 may be executed in a variety of different orders.

After mask data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams is used to form a pattern on a mask (photomask or reticle) 1045 based on the modified IC design layout diagram 1022. Mask 1045 can be formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1045 includes a transparent substrate (e.g., fused quartz) and an opaque material (e.g., chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 includes wafer fabrication 1052. IC fab 1050 is an IC fabrication business that includes one or more manufacturing facilities for the fabrication of a variety of different IC products. In some embodiments, IC Fab 1050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1050 uses mask(s) 1045 fabricated by mask house 1030 to fabricate IC device 1060. Thus, IC fab 1050 at least indirectly uses IC design layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC design layout diagram 1022. Semiconductor wafer 1053 includes a silicon substrate or other proper substrate having material layers formed thereon. Semiconductor wafer 1053 further includes one or more of various doped regions, dielectric features, multilevel interconnects, and the like (formed at subsequent manufacturing steps).

Details regarding an integrated circuit (IC) manufacturing system (e.g., system 1000 of FIG. 10), and an IC manufacturing flow associated therewith are found, e.g., in U.S. Pat. No. 9,256,609, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

The present disclosure provides, in some embodiments, a plurality of testing units, a plurality of testing pads, and an APCM for testing metal structures surrounded by TSVs. As such, the above-identified technical issues can be resolved.

One aspect of this description relates to a testing apparatus including an advance process control monitor (APCM) in a first wafer, a plurality of pads disposed over and coupled to the APCM. The plurality of pads are in a second wafer. The testing apparatus includes a testing unit disposed between the first wafer and the second wafer. The testing unit is coupled to the APCM. The testing unit includes a metal structure within a dielectric. The testing apparatus includes a plurality of through silicon vias (TSVs) extending in a first direction from the first wafer, through the dielectric of the testing unit, to the second wafer.

In some embodiments, the APCM and the plurality of pads are in a scribe portion of the first wafer and the second wafer, respectively. In some embodiments, the testing unit is disposed in between a die portion of the first wafer and the second wafer, wherein the die portion abuts with the scribe portion along the first direction.

In some embodiments, a second plurality of pads disposed between the plurality of pads and the APCM. In some embodiments, a second plurality of TSVs extending in the first direction from the plurality of pads to the second plurality of pads.

In some embodiments, the plurality of TSVs extend from a lower surface of the first wafer to an upper surface of the second wafer. In some embodiments, the APCM includes switching devices and a control circuit that is configured to selectively activate the switching devices. In some embodiments, the testing apparatus is configured to test a first and a second testing unit of the plurality of testing units at a same time.

Another aspect of this description relates to a testing apparatus including a first wafer having a bottom surface, a metal layer disposed over the first wafer, a second wafer disposed over the metal layer and having a top surface, and a plurality of through silicon vias (TSVs) extending in a first direction from the bottom surface of the first wafer to the top surface of the second wafer. In some embodiments, the metal layer includes a metal structure and a dielectric surrounding the metal structure. In some embodiments, the plurality of TSVs are separated from the metal structure in a second direction perpendicular to the first direction.

In some embodiments, the first wafer includes advance process control monitor (APCM) coupled to the metal structure and the second wafer includes a plurality of pads coupled to the APCM. In some embodiments, the testing apparatus includes a die portion and a scribe portion abutting with the die portion along the first direction, wherein the metal structure is located in the die portion and the APCM and the plurality of pads are located in the scribe portion.

Another aspect of this description relates to a testing unit including a metal layer including a metal structure, a dielectric surrounding the metal structure, and a plurality of TSVs extending in a first direction perpendicular to the metal layer and separated from the metal structure. In some embodiments, the metal layer is disposed in between a first wafer and a second wafer in the first direction. In some embodiments, the plurality of TSVs extend to the first and second wafers.

In some embodiments, each of the plurality of TSVs are a same distance from a nearest one of the plurality of TSVs in a second direction perpendicular to the first direction. In some embodiments, the metal structure is coupled to first, second, third, and fourth contacts. In some embodiments, a current applied at the first contact, an equal and opposite current is applied at the second contact, and a voltage is measured across the third and fourth contacts.

In some embodiments, the metal layer includes a second metal structure. In some embodiments, current is applied through the metal structure and a leakage current is measured in the second metal structure. In some embodiments, the metal structure includes a plurality of metal structure segments and contacts are coupled to each of the plurality of metal structure segments.

In some embodiments, the testing apparatus further includes a second metal layer disposed over the metal layer. In some embodiments, the second metal layer including a second metal structure disposed over the metal structure. In some embodiments, a capacitance is measured across the metal structure and the second metal structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A testing unit comprising a metal layer including:
a metal structure;
a dielectric surrounding the metal structure; and
a plurality of TSVs extending in a first direction perpendicular to the metal layer and separated from the metal structure;
wherein the metal structure is coupled to first, second, third, and fourth contacts, wherein a current is applied at the first contact, an equal and opposite current is applied at the second contact, and a voltage is measured across the third and fourth contacts.

2. The testing unit of claim 1, wherein the metal layer is disposed in between a first wafer and a second wafer in the first direction.

3. The testing unit of claim 2, wherein the plurality of TSVs extend to the first and second wafers.

4. The testing unit of claim 1, wherein each of the plurality of TSVs are a same distance from a nearest one of the plurality of TSVs in a second direction perpendicular to the first direction.

5. The testing unit of claim 1, where the metal layer includes a second metal structure, wherein a current is applied through the metal structure and a leakage current is measured in the second metal structure.

6. The testing unit of claim 1, wherein the metal structure comprises a plurality of metal structure segments and contacts are coupled to each of the plurality of metal structure segments.

7. The testing unit of claim 1, further comprising a second metal layer disposed over the metal layer, the second metal layer including a second metal structure disposed over the metal structure, and wherein a capacitance is measured across the metal structure and the second metal structure.

8. A testing unit comprising a metal layer including:
a metal structure;
a dielectric surrounding the metal structure;
a plurality of TSVs extending in a first direction perpendicular to the metal layer and separated from the metal structure; and
a second metal layer disposed over the metal layer, the second metal layer including a second metal structure disposed over the metal structure, and wherein a capacitance is measured across the metal structure and the second metal structure.

9. The testing unit of claim 8, wherein the metal layer is disposed in between a first wafer and a second wafer in the first direction.

10. The testing unit of claim 9, wherein the plurality of TSVs extend to the first and second wafers.

11. The testing unit of claim 8, wherein each of the plurality of TSVs are a same distance from a nearest one of the plurality of TSVs in a second direction perpendicular to the first direction.

12. The testing unit of claim 8, where the metal layer includes a second metal structure, wherein a current is applied through the metal structure and a leakage current is measured in the second metal structure.

13. The testing unit of claim 8, wherein the metal structure comprises a plurality of metal structure segments and contacts are coupled to each of the plurality of metal structure segments.

14. The testing unit of claim 8, wherein the metal structure is coupled to first, second, third, and fourth contacts, wherein a current is applied at the first contact, an equal and opposite current is applied at the second contact, and a voltage is measured across the third and fourth contacts.

15. A testing unit comprising a metal layer including:
a metal structure;
a dielectric surrounding the metal structure;
a plurality of TSVs extending in a first direction perpendicular to the metal layer and separated from the metal structure; and
a second metal layer disposed over the metal layer, the second metal layer including a second metal structure disposed over the metal structure, and wherein a capacitance is measured across the metal structure and the second metal structure;
wherein the metal structure is coupled to first, second, third, and fourth contacts, wherein a current is applied at the first contact, an equal and opposite current is applied at the second contact, and a voltage is measured across the third and fourth contacts.

16. The testing unit of claim 15, wherein the metal layer is disposed in between a first wafer and a second wafer in the first direction.

17. The testing unit of claim 16, wherein the plurality of TSVs extend to the first and second wafers.

18. The testing unit of claim 15, wherein each of the plurality of TSVs are a same distance from a nearest one of the plurality of TSVs in a second direction perpendicular to the first direction.

19. The testing unit of claim 15, where the metal layer includes a second metal structure, wherein a current is applied through the metal structure and a leakage current is measured in the second metal structure.

20. The testing unit of claim 15, wherein the metal structure comprises a plurality of metal structure segments and contacts are coupled to each of the plurality of metal structure segments.

* * * * *